US012603606B2

(12) United States Patent
Dekker

(10) Patent No.: US 12,603,606 B2
(45) Date of Patent: Apr. 14, 2026

(54) PHOTOVOLTAIC MODULE ASSEMBLY

(71) Applicant: Nederlandse Organisatie voor toegepast-natuurwetenschappelijk Onderzoek TNO, The Hague (NL)

(72) Inventor: Nicolaas Jacobus Joseph Dekker, The Hague (NL)

(73) Assignee: Nederlandse Organisatie voor toegepast-natuurwetenschappelijk Onderzoek TNO, The Hague (NL)

( * ) Notice: Subject to any disclaimer, the term of this patent is extended or adjusted under 35 U.S.C. 154(b) by 0 days.

(21) Appl. No.: 18/247,749

(22) PCT Filed: Oct. 6, 2021

(86) PCT No.: PCT/EP2021/077516
§ 371 (c)(1),
(2) Date: Apr. 4, 2023

(87) PCT Pub. No.: WO2022/074038
PCT Pub. Date: Apr. 14, 2022

(65) Prior Publication Data
US 2023/0370018 A1     Nov. 16, 2023

(30) Foreign Application Priority Data

Oct. 6, 2020     (EP) ..................................... 20200198

(51) Int. Cl.
H02S 40/34          (2014.01)
H02S 40/36          (2014.01)
*H10F 19/90*          (2025.01)

(52) U.S. Cl.
CPC .............. *H02S 40/34* (2014.12); *H02S 40/36* (2014.12); *H10F 19/908* (2025.01)

(58) Field of Classification Search
CPC .......... H02S 40/34; H02S 40/36; H02S 50/00; H02S 40/30; H01L 31/0516; Y02E 10/50
See application file for complete search history.

(56) References Cited

U.S. PATENT DOCUMENTS 10,554,050 B2      2/2020  Dai et al.
2013/0106194 A1*   5/2013  Jergovic ................. H02J 3/381
                                                            307/77

(Continued)

FOREIGN PATENT DOCUMENTS

WO        2012/107919 A1     8/2012
WO        2015/001413 A1     8/2012
WO        2015/150471 A1     10/2015

*Primary Examiner* — Michael Y Sun
(74) *Attorney, Agent, or Firm* — Ipsilon USA—NLO

(57)          ABSTRACT

A photovoltaic (PV) module (1) comprising a positive terminal (5), a negative terminal (6), and at least two sub-modules. Each of the at least two sub-modules (10*a-c*) comprises x parallel-connected sub-strings (13), wherein each of the x parallel-connected sub-strings (13) comprises y series-connected sub-cells (16), wherein the y series-connected sub-cells (16) are arranged in an array. The PV module (1) further comprises a back conductive sheet having a first connection pattern arranged for connecting the x parallel-connected sub-strings (13) of each of the at least two sub-modules (10*a-c*), wherein each of the at least two sub-modules (10*a-c*) is provided with a power optimizer circuit (21*a-c*), and the output of the power optimizer circuits (21*a-c*) are connected in series between the positive terminal (5) and the negative terminal (6).

14 Claims, 4 Drawing Sheets

(56)         References Cited

U.S. PATENT DOCUMENTS

2015/0280641 A1* 10/2015 Garg .................. H01L 31/0504
                                                      136/244
2017/0186900 A1*  6/2017 van Aken ............. H02S 40/34
2017/0186902 A1*  6/2017 Jansen ................ H10F 77/937

* cited by examiner

PHOTOVOLTAIC MODULE ASSEMBLY

FIELD OF THE INVENTION

The present invention relates to a photovoltaic module comprising a positive terminal, a negative terminal, at least two sub-modules, wherein each of the at least two sub-modules comprises x parallel-connected sub-strings, wherein each of the x parallel-connected sub-strings comprises y series-connected sub-cells, and wherein the y series-connected sub-cells are arranged in an array.

BACKGROUND ART

International patent publication WO 2015/150471 discloses a photovoltaic module with a negative terminal and a positive terminal, and a parallel connection of m sub-modules connected to the negative and the positive terminal of the photovoltaic module. Each of the m sub-modules has a string of n series-connected back-contact cells, wherein the n cells of each sub-module are arranged in an array. The parallel connection and connections for each string of n series-connected back contact cells are provided in a back conductive sheet, and the back conductive sheet comprises designated areas for the parallel connection, corresponding to edge parts of each corresponding sub-module.

International patent publication WO 2015/001413 discloses a solar cell assembly including one or more solar cell units coupled in series. The solar cell unit further includes a first solar cell series and a second solar cell series connected in parallel. The first and second solar cell series include a plurality of solar cells connecting in series respectively. The solar cell assembly also includes a by-pass diode coupled to each solar cell unit and shared between the first and second solar cell series in each solar cell unit.

US patent publication US2018/309300 relates a solar power system with a plurality of power modules, wherein each one of the power modules comprises a solar panel (i.e. sub-modules) and a power optimizer.

International patent publication WO2012/107919 discloses a solar panel that is protected against cell burnout in partial shaded conditions. The solar power collector panel has three substrings, and each substring comprises eighteen cells. Each substring is controlled by a corresponding MPP controller.

SUMMARY OF THE INVENTION

The present invention seeks to provide a photovoltaic module of easy assembly and low costs, yet providing improved performance in partial shade conditions.

According to the present invention, a photovoltaic module as defined above is provided, further comprising a back conductive sheet having a first connection pattern arranged for connecting the x parallel-connected sub-strings of each of the at least two sub-modules, wherein each of the at least two sub-modules is provided with a power optimizer circuit and the output of the power optimizer circuits are connected in series between the positive terminal and the negative terminal.

The present invention embodiments have the advantage that a photovoltaic module is provided with improved shadow performance and hot-spot prevention, and in the absence of by-pass diodes, thereby allowing easy assembly of the photovoltaic module with associated low costs.

SHORT DESCRIPTION OF DRAWINGS

The present invention will be discussed in more detail below, with reference to the attached drawings, in which FIG. 1 shows a schematic view of a photovoltaic module, according to an embodiment of the present invention;

DESCRIPTION OF EMBODIMENTS

In principal, a solar panel comprises multiple series-connected (solar) cells for conversion of sunlight into electrical energy. However, such solar panels are sensitive to (partial) shade conditions, where even shade on a single solar cell can greatly affect the electrical output of a solar panel. Furthermore, shade also has the tendency to create localized areas of heat in the solar panel, known as hot-spot heating. This can occur in a group of series-connected cells having shaded and unshaded cells, whereby the power output of the unshaded cells is dissipated in the shaded cells, leading to local overheating in small areas. This, in turn, can even result in destructive effects, such as melting or degradation of the solar panel.

In order to reduce this effect, bypass diodes are typically incorporated into solar panels as to create an alternative current path, allowing electricity to 'flow around' the group with shaded cells per bypass diode, where, as a result, hot-spot heating is reduced. As a result, a standard 60 solar cell panel would be equipped with e.g. 3 bypass diodes, where a single bypass diode would be typically connected across a group of e.g. 20 series-connected solar cells.

However, even with the series connection of 20 solar cells per bypass diode, the power output of these solar panels are still sensitive to partial shade. Furthermore, under certain shade conditions, the shaded cell may reach temperatures well above 150° C., which is ideally not favorable for the lifetime of the solar panel. To overcome these issues, each solar cell in the solar panel could be connected to a bypass diode. However, this not only proves to be very costly, but it is also difficult to integrate such a large number of bypass diodes into a standard solar panel owing to e.g. complex wiring.

Moreover, the power loss of the solar panel, under (partial) shade conditions, can be considerable, owing to losses from every shaded solar cell, and the additional loss per bypass diode. Typically, the loss of power owing to the presence of shade on one cell can be equated to the power generated by two solar cells.

In this regard, there is a need in the art to overcome these drawbacks, and provide a solar panel that would provide excellent performance under (partial) shade conditions in the absence of bypass diodes, and of easy assembly with associated low (manufacturing) costs. Furthermore, it would also be highly desirable to further improve the performance of a solar panel under (partial) shade conditions, by e.g. increasing the shade linearity.

The present invention embodiments provide a photovoltaic (PV) module with hot-spot prevention in the absence of by-pass diodes, yet, provide good shadow performance.

Figure 1:
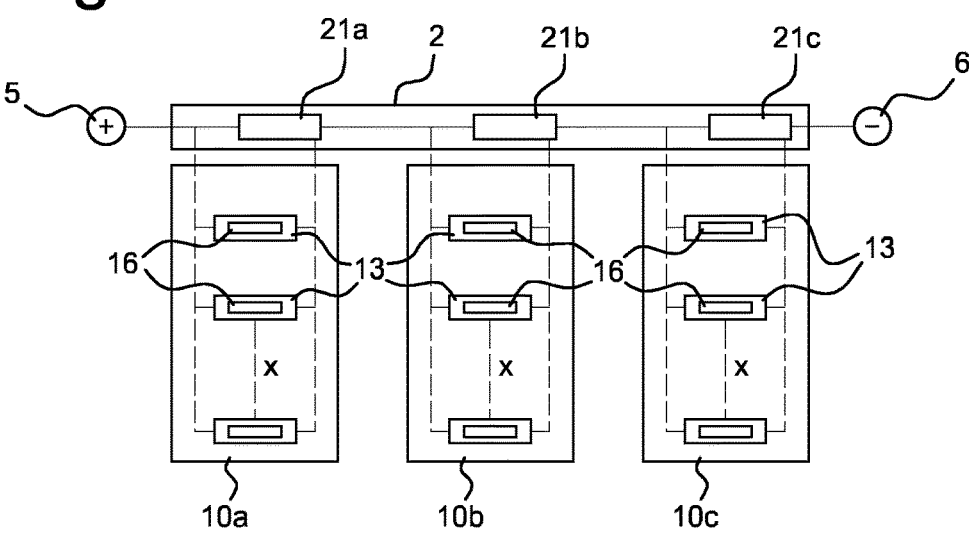

FIG. 1 shows a schematic view of a PV module 1, according to an embodiment of the present invention. The PV module 1 comprises a positive terminal 5, a negative terminal 6, and at least two sub-modules 10a-c (three in this exemplary embodiment). In view of FIG. 1, the at least two sub-modules 10a-c are positioned laterally to one another i.e. side-by-side.

Further, in this embodiment, each of the at least two sub-modules 10a-c comprises x parallel-connected sub-strings 13. Each of the x parallel-connected sub-strings 13 comprises y series-connected sub-cells 16, wherein the y series-connected sub-cells 16 are arranged in an array in this embodiment. Alternatively stated, the y series-connected sub-cells 16 (also known as mini-cells in the field of the invention) are arranged in a geometric pattern, wherein the y series-connected sub-cells 16 are connected in series in the x parallel-connected sub-strings 13, and wherein the x parallel-connected sub-strings 13 are connected in parallel.

In any one of the embodiments described herein, the y series-connected sub-cells 16 may comprise back-contact solar cells. Back-contact solar cells are characterized as having contacts available on the back-side of a solar cell, as to leave as much as possible of the front-side of a solar cell exposed to sunlight (where front-side contacts would otherwise cause shading), thereby increasing the efficiency performance.

Furthermore, back-contact solar cells also increases panel manufacturing efficiency. In a standard (H-panel) solar panel comprising e.g. 60 cells, the cells are connected in series by having the front of one cell connected to the back of another cell. These front and back connections present a critical and time consuming step, whereby micro cracks can arise in the cells.

To that end, the y series-connected sub-cells 16 may comprise various types of back-contact solar cells, for example, Metal Wrap Through (MWT), Emitter Wrap Through (EWT) or Interdigitated Back-Contact (IBC) solar cells.

In the embodiment shown in FIG. 1, the PV module 1 further comprises a back conductive sheet having a first connection path arranged for connecting the x parallel-connected sub-strings 13 of each of the at least two sub-modules 10a-c. The first connection path is schematically depicted as the dashed line in FIG. 1, providing parallel connection of the x parallel-connected sub-strings 13. The pattern of the first connection path provided by the back conductive sheet is such that the xparallel-connected sub-strings 13 are connected in parallel in each of the at least two sub-modules 10a-c. The first connection path may have comprise various patterns, e.g. an interdigitated shape pattern, for connecting the x parallel-connected sub strings 13.

The back conductive sheet may comprise a patterned conductive foil e.g. copper or aluminum foil, and may be based on back-contacted technology (for co-operative association with back-contact solar cells are described herein). Conductive adhesive or low-temperature solder may be applied to the contact points of the y series-connected sub-cells 16 and/or the back conductive sheet for electrical connection thereof.

In a specific embodiment, the back conductive sheet provides a plurality of second connection paths arranged for connecting the y series-connected sub-cells 16 of each x parallel-connected sub-string 13. For example, the plurality of second connection paths may comprise insulated wiring islands, provided in the back conductive sheet, to form e.g. a local string wiring chain as to series connect the y series-connected sub-cells 16.

In this respect, the back conductive sheet may provide both the first connection pattern for connecting the x parallel-connected sub strings 13, and the plurality of second connection paths for connecting the y series-connected sub-cells 16, whereby the back conductive sheet is designed such that the first connection pattern does not interfere with the plurality of second connection paths.

From this perspective, in another specific embodiment, the first connection path is isolated from the plurality of second connection paths. The back conductive sheet may comprise a single back conductive sheet with isolation scribes to separate the first connection path and plurality of second connection paths. The isolation scribes may be formed in the single back conductive sheet using etching or other scribe line techniques.

Alternatively, the back conductive sheet may comprise a primary sheet layer and a secondary sheet layer to provide the first connection path and plurality of second connection paths, respectively. The isolation may then be provided in the form of an isolation sheet between the primary and secondary sheet layers, to ensure proper electrical isolation. Further information on other embodiments regarding the first connection path, the plurality of second connection paths and the isolation and connections thereof can be found in international publication WO 2015/150471, which is incorporated herein by reference.

In the embodiment shown in FIG. 1, each of the at least two sub-modules 10a-c is provided with a power optimizer circuit 21a-c, and the output of the power optimizer circuits 21a-c are series connected.

In this context, the embodiments described herein provide a PV module 1 with a series/parallel connection configuration in each of the at least two sub-modules 10a-c, wherein each of the least two sub-modules 10a-c comprises x parallel-connected sub-strings 13, and wherein each of the x parallel connected sub-strings 13 comprises y series-connected sub-cells 16.

The power optimizer circuits 21a-c are arranged to optimize the power output from the at least two sub-modules 10a-c, whereby this is related to improve the performance of the at least two sub-modules 10a-c under (partial) shade conditions.

To elaborate this further, a non-limiting example is described. In view of FIG. 1, for one sub-module e.g. the sub-module with reference numeral 10a, if a shadow falls on one sub-string of the x parallel-connected sub-strings 13, then the total current of the x parallel-connected sub-strings 13 in sub-module 10a will decrease. Given this situation, if sub-module 10a was connected in series with the other sub-modules 10b-c without power optimizer circuits 21a-c i.e. all sub-modules 10a-c are connected in series, then the total current of the PV module 1 is significantly limited by sub-module 10a. In other wording, without power optimizer circuits 21a-c, a small shadow on sub-module 10a can greatly affect the performance of the PV module 1.

For this reason, by providing power optimizer circuits 21a-c for each of the at least two sub-modules 10a-c, the power output of the PV module 1 is optimized and the losses in (partial) shade conditions are minimized. In relation to the non-limiting example described above, if a shadow is present on one sub-string of the x parallel-connected sub-strings 13 in sub-module 10a, the power optimizer circuit 21 a, associated with sub-module 10a, will optimize the current in sub-module 10a. Specifically, the power optimizer 21a will increase the current in sub-module 10a to the level whereby the other sub-modules 21a-c would deliver their maximum output.

Hence, the presence of power optimizer circuits 21a-c in the configuration of the PV module 1, as described herein, allows optimization of the power output in each of the at least two sub-modules 10a-c, whereby a shadow on e.g. one sub-module will not influence the power output of the other sub-modules. The technical effect is that all of the y series-connected sub-cells 16 in the PV module 1 will maximally contribute to the power output of the PV module 1, whereby none of the y series-connected sub-cells 16 are by-passed, and, thus, the performance of the PV module 1 is improved and optimized in (partial) shade conditions.

In a further embodiment, y is less than or equal to 20, i.e. the number of y series-connected sub-cells 16, in each of the x parallel-connected sub-strings 13 in each of the at least two sub-modules 10a-c, is limited to be no more than 20. As described herein, although by-pass diodes are generally incorporated into solar panels to avoid the destructive effects of hot-spot heating, this can prove quite costly and difficult to integrate if a large number of series-connected solar cells are present. In this respect, by limiting y to less than or equal to 20, the effects of hot-spot heating are non-destructive i.e. it is safe from the effects of hot-spot heating. For example, if y is assumed to be 20, than the reverse voltage per cell is the same as in a standard 60 cell PV module with 3 by-pass diodes i.e. a by-pass diode per 20 solar cells, and, thus, hot-spot heating is limited.

Hence, if y is less than or equal to 20, this obviates the need for by-pass diodes in the PV module 1 to limit hot-spot heating, allowing easy assembly of the PV module 1 and of low (manufacturing) costs. For example, the skilled person would appreciate the simplicity of wiring the PV module 1 in the absence of having to integrate e.g. by-pass diodes into the back conductive sheet.

In another embodiment, x is at least 2. In other wording, the number of x parallel-connected sub-strings 13, in each of the at least two sub-modules 10a-c, is more than or equal to 2.

In yet another example of the PV module 1 and its configuration, assuming 16 parallel-connected sub-strings 13 (i.e. x is 16) and 20 series-connected sub-cells 16 (i.e. y is 20) in each of the at least two sub-modules 10a-c, the current for the power optimizer circuits 21a-c is the same as that extracted from a sub-string of 20 equivalent solar cells in a standard 60 cell PV module. This further illustrates the advantages of the power optimizer circuits 21a-c in the present invention, which can be implemented and used in the same manner as state-of-the-art systems e.g. standard 60 cell modules.

In more general wording, the present invention embodiments as described above all relate to a photovoltaic (PV) module 1, comprising a positive terminal 5, a negative terminal 6, at least two sub-modules 10a-c, wherein each of the at least two sub-modules 10a-c comprises x parallel-connected sub-strings 13, wherein each of the x parallel-connected sub-strings 13 comprises y series-connected sub-cells 16, wherein the y series-connected sub-cells 16 are arranged in an array. The PV module 1 further comprises a back conductive sheet having a first connection pattern arranged for connected the x parallel-connected sub-strings 13 of each of the at least two sub-modules 10a-c, wherein each of the at least two sub-modules 10a-c is provided with a power optimizer circuit 21a-c, and the output of the power optimizer circuits 21a-c are connected in series between the positive terminal 5 and the negative terminal 6. All the embodiments described herein provides a PV module 1 with good performance in (partial) shade conditions and without the need for bypass diodes to prevent hotspots, yet of easy assembly and associated low manufacturing costs.

In a further embodiment shown in FIG. 1, the PV module 1 comprises a junction box 2 comprising connection circuitry providing the connection of the at least two sub-modules 10a-c to the associated power optimizer circuit 21a-c and to the positive and negative terminal 5, 6. In alternative wording, the junction box 2 comprises the power optimizer circuits 21a-c, and provides the connection circuitry of the power optimizer circuits 21a-c to the associated one of the at least two sub-modules 10a-c, and to the positive and negative terminal 5, 6. The junction box 2 allows easy accommodation of the power optimizer circuits 21a-c and the associated connection circuitry, and acts as the output interface of the PV module 1.

In general, the junction box 2 may be placed on the back-side of the PV module 1 i.e. out of direct sunlight. In the embodiment shown in FIG. 1, the junction box 2 is positioned on one side of the at least two sub-modules 10a-c i.e. at the top of the PV module 1, but may be placed in various positions in other embodiments e.g. at the bottom or side of the PV module 1.

In an further embodiment, the power optimizer circuit 21a-c comprises an integrated circuit. Alternatively stated, the power optimizer circuit 21a-c is an electronic circuit that is fabricated into a miniaturized unit e.g. a chip. For example, the electronic circuit may comprise a small integrated circuit, a coil and small SMD capacitors. In an exemplary embodiment, the integrated circuit is provided in a laminated layer of the PV module 1. Here, the integrated circuit may comprise of an integrated chip laminated in the PV module 1 itself, thus, allowing easy integration of the power optimizer circuits 21a-c as an integrated circuit in e.g. a laminated layer.

In order to further improve the (partial) shading behavior of the PV module 1, another embodiment is provided, whereby the power optimizer circuit 21a-c comprises a buck converter with maximum power point (MPP) tracking. In general, MPP tracking is a well-established technique commonly used in PV systems to maximize the power output of a PV module 1, where the MPP represents the optimum value of current and voltage that results in maximum power output.

By providing a buck converter with MPP tracking in the power optimizer circuits 21a-c in this embodiment, the voltage and current of each of the at least two sub-modules 10a-c is such that the maximum power in each of the at least two sub-modules 10a-c is extracted, even in the presence of shade. Thus, this leads to even better performance of the PV module 1 in (partial) shading conditions, whereby the at least two sub-modules 10a-c operate at MPP and deliver at maximum power output.

Figure 2:
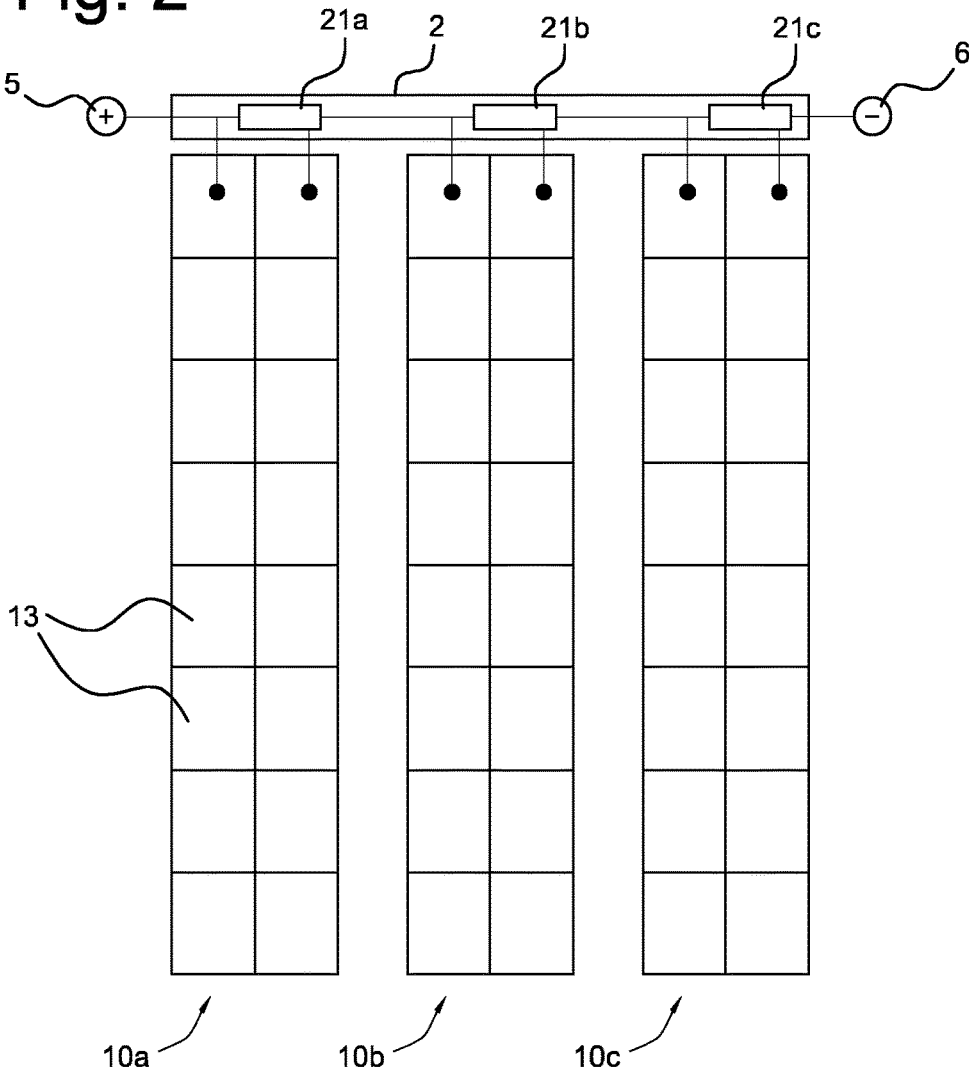
FIG. 2 shows a schematic view of a photovoltaic module, according to another embodiment of the present invention.

FIG. 2 shows a schematic plan view of a PV module 1, according to an exemplary embodiment of the present invention. The PV module 1 comprises at least two sub-modules 10a-c (three in this exemplary embodiment), wherein each of the at least two sub-modules 10a-c comprises x parallel-connected sub-strings 13, wherein the x parallel-connected sub-strings 13 are arranged in a rectangular array. In other wording, each of the at least two sub-modules 10a-c comprises x parallel-connected sub-strings 13 arranged in a rectangular array, resulting in each of the at least two sub-modules 10a-c having a rectangular footprint. In the exemplary embodiment shown in FIG. 2, the x parallel-connected sub-strings 13 (in each of the at least two sub-modules 10a-c) are arranged in a 2×8 array (i.e. x is 16 in this exemplary embodiment). It is noted the 2×8 array in FIG. 2 is an exemplary embodiment, and the x parallel-connected sub-strings may be arranged in other configurations, for example a 4×4 array, in other embodiments.

Figure 3A:
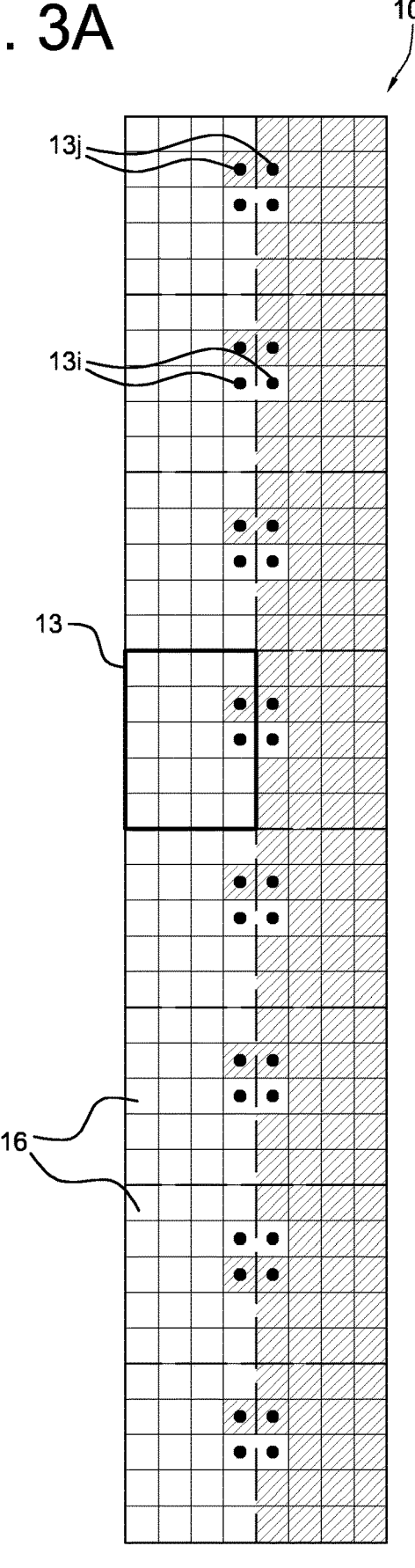
FIG. 3A shows a schematic view of a sub-module of the photovoltaic module embodiment of FIG. 2.

FIG. 3A shows a schematic plan view of one sub-module 10a of the at least two sub-modules 10a-c, according to the embodiment of FIG. 2. In view of FIG. 3A, the sub-module 10a as shown is divided into a negative and positive section, indicated by the unshaded and (diagonal line) shaded sections respectively, separated and isolated by e.g. an isolation scribe. Further, as shown in FIG. 3A, the x parallel-connected sub-strings 13 are arranged in a rectangular array with each a sub-string negative terminal 13i, and sub-string positive terminal 13j.

Figure 3B:
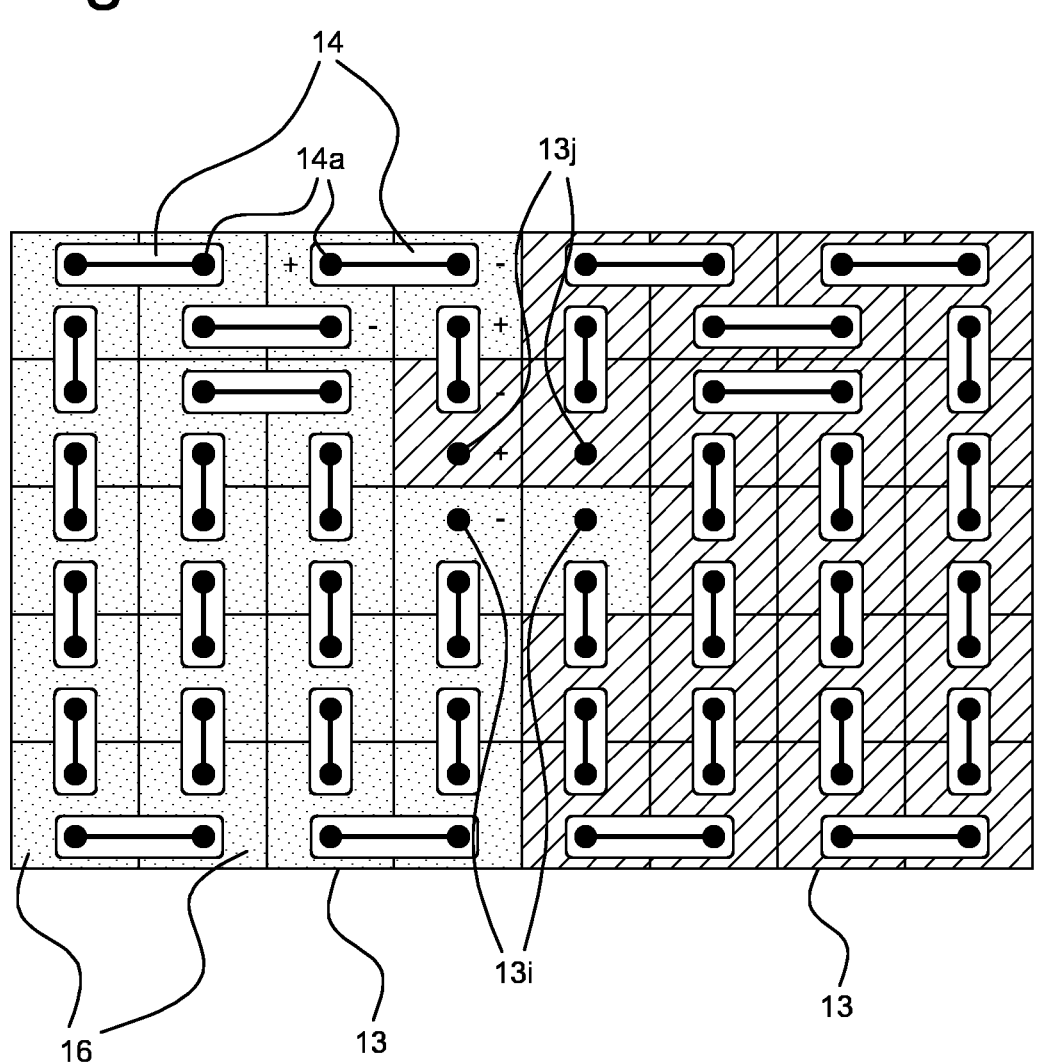
FIG. 3B shows a schematic view of a sub-string of the sub-module embodiment of FIG. 3A.

FIG. 3B shows a schematic view of two sub-strings of the x parallel-connected sub-strings 13, according to the embodiment of FIG. 2 and FIG. 3A, wherein the y series-connected sub-cells 16 are arranged in a rectangular array and are interconnected in an meandering pattern. This results in the x parallel-connected sub-strings 13 having a rectangular footprint, and in combination with the embodiment in FIG. 2 described above, gives the PV module 1 a general rectangular footprint. Please note that for illustrative purposes, the two sub-strings of the x parallel-connected sub-strings 13, as shown in FIG. 3B, presenting a part of the negative and positive section of the sub-module 10a, have been indicated by a dot shaded and diagonal line shaded areas, respectively.

The y series-connected sub-cells 16, depicted as small squares in FIG. 3A-B, are arranged in a 4×5 array, i.e. y is 20 in this embodiment. Similarly, the rectangular array may be arranged as e.g. a 4×4 array in other embodiments. By arranging the y series-connected sub-cells 16 in an rectangular array, the PV module 1 is less vulnerable to elongated shade patterns, whereby the direction of the elongation is arbitrary, and, thus, the PV module 1 has better shade tolerance.

Furthermore, the y series-connected sub-cells 16 are interconnected by connections in the form of a meandering pattern, provided by a local string wiring chain using insulated wiring islands 14, as shown in FIG. 3B. This allows good, compact arrangement of the y series-connected sub-cells 16 in a rectangular array, whilst keeping them connected in series.

Each of the insulated wiring islands 14 comprise two insulated wiring island terminals 14a, i.e. one positive + and one negative − as depicted in FIG. 3B, as to connect one series-connected sub-cell 16 to e.g. a neighbouring series-connected sub cell 16. In more detail, the y series-connected sub cells 16 are interconnected using simple straight connection strips, as depicted in FIG. 3B by the straight solid lines between the two insulated wiring island terminals 14a in each of the insulated wiring islands 14.

Naturally, there are multiple variations of the meandering pattern, and it is re-iterated that the meandering pattern in FIG. 3B represents a non-limiting example, where other variations of the meandering pattern and connections may be used to interconnect the y series-connected sub-cells 16. For example, bent connection strips or fork-shaped connections, providing a more concave interconnection between the y series-connected sub-cells 16, may be considered.

For the embodiments described in FIG. 2 and FIGS. 3a-b, a large number of y series-connected sub-cells 16 can be envisaged. To elaborate, a non-limiting example of the PV module 1 that relates to the present invention embodiments is described. In view of FIG. 2 and FIGS. 3A-B, the PV module 1 comprises 3 sub-modules 10a-c, wherein each of the 3 sub-modules 10a-c comprises 16 parallel-connected sub-strings 13 (i.e. x is 16) arranged in a rectangular array, and wherein each of the 16 parallel-connected sub-strings 13 comprises 20 series-connected sub-cells 16 (i.e. y is 20) also arranged in a rectangular array. This gives a total number of 960 sub-cells 16 in the PV module 1, with a 20/16 series/parallel connection configuration in each of the sub-modules 10a-c.

Therefore, in relation to the embodiments described herein, the present invention discloses many advantages over state-of-the-art systems. As already described above, in the presence of 20 series-connected sub-cells 16, this is equal to the number of cells per by-pass diode in standard 60 cell module i.e. a by-pass diode is provided per sub-string of 20 cells in state-of-the-art systems. Further, in the presence of 16 parallel-connected sub-strings 13, the current obtained is equal to the current output from a standard 60 cell module.

Subsequently, by the combination of 16 parallel-connected sub-strings 13 and 20 series-connected sub-cells 16 (i.e. a 20/16 series/parallel connection configuration in each of the sub-modules 10a-c), the current and voltage is equivalent to that obtained by 20 standard cells (per by-pass diode) connected in series in a standard 60 cell panel.

Furthermore, in combination with the power optimizer circuits 21a-c, the series/parallel connection configuration of the present invention provides improved shadow linearity. To elaborate, in a standard 60 solar cell module, in the presence of shade on one cell, all the cells in the panel will be set to a lower current, or the sub-string of 20 solar cells comprising the shaded cell will be switched off by the by-pass diode. In the latter, the module may lose a third of its power output, even though the shadow is less than 1% of its total panel area.

In comparison, owing to the presence of power optimizer circuits 21 a-c, all of the y series-connected sub-cells 16 in the present invention would continue to supply electricity in the presence of a shadow. By presence of shade on one sub-cell, only the sub-string comprising the shaded sub-cell will have a decreased electrical output, whereby maximum electrical output is still extracted.

In this regard, the PV module 1 provides improved shadow linearity in comparison to e.g. a standard 60 cell module, where each of the x parallel-connected sub-strings 13 delivers the power based on the amount of shade that falls on the PV module 1. In other wording, the PV module 1 has an significantly improved shadow linearity in comparison to a standard 60 cell module. Owing to the simplicity of the series/parallel connection configuration, these advantages and technical effects are achieved with a limited amount standard electronics and instrumentation, whereby the PV module 1 is of easy wiring and assembly.

Figure 4:
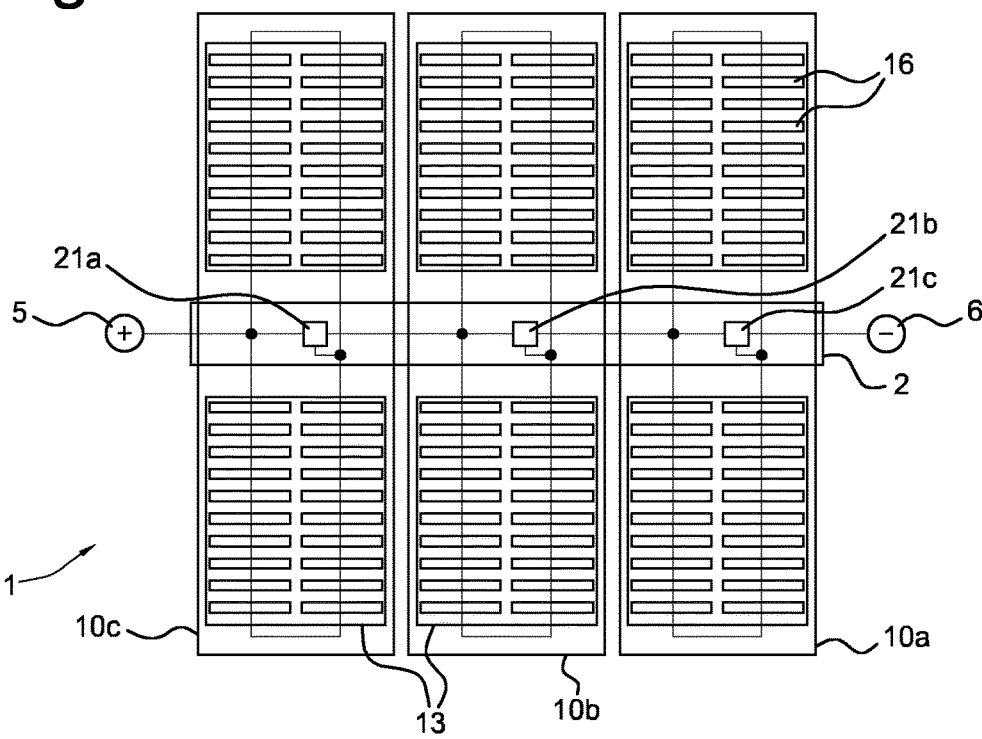
FIG. 4 shows a schematic view of a photovoltaic module, according to a 'Split-Cell' module embodiment of the present invention.

FIG. 4 shows a schematic view of a photovoltaic module, according to a further exemplary embodiment of the present invention. In this further exemplary embodiment, each of the x parallel-connected sub-strings 13 comprises y series-connected sub-cells 16, wherein the y series-connected sub-cells 16 each comprise a string of split sub-cells, wherein the split sub-cells comprise e.g. half-cut or third-cut sub-cells It is well-established in the art that half-cut and third-cut (solar) cells can result in less resistive losses owing to their smaller currents, and, thus, lead to increased efficiency of a solar panel.

In the exemplary embodiment shown in FIG. 4, each of the x parallel-connected sub-strings 13 may comprise e.g. 2×10 half-cut sub-cells connected in series. In combination with at least two sub-modules 10a-c (three in this further exemplary embodiment), this provides a 'regular' PV module 1 as described in any one of the embodiments herein, whereby strings of half-cut sub-cells provides better efficiency performance of the PV module 1.

As another exemplary embodiment, each sub-module 10a-c may comprise e.g. 2 parallel-connected sub-strings 13, wherein each of the 2 parallel-connected sub-strings 13 may comprise a string of third-cut sub-cells, originating from e.g. a 210 mm×210 mm wafer cut into ⅓ strokes.

Furthermore, in comparison to state-of-the-art half-cut or third-cut solar cell modules, the shadow performance of the split-cell module is significantly improved by the presence of power optimizer circuits 21a-c.

Figure 5:
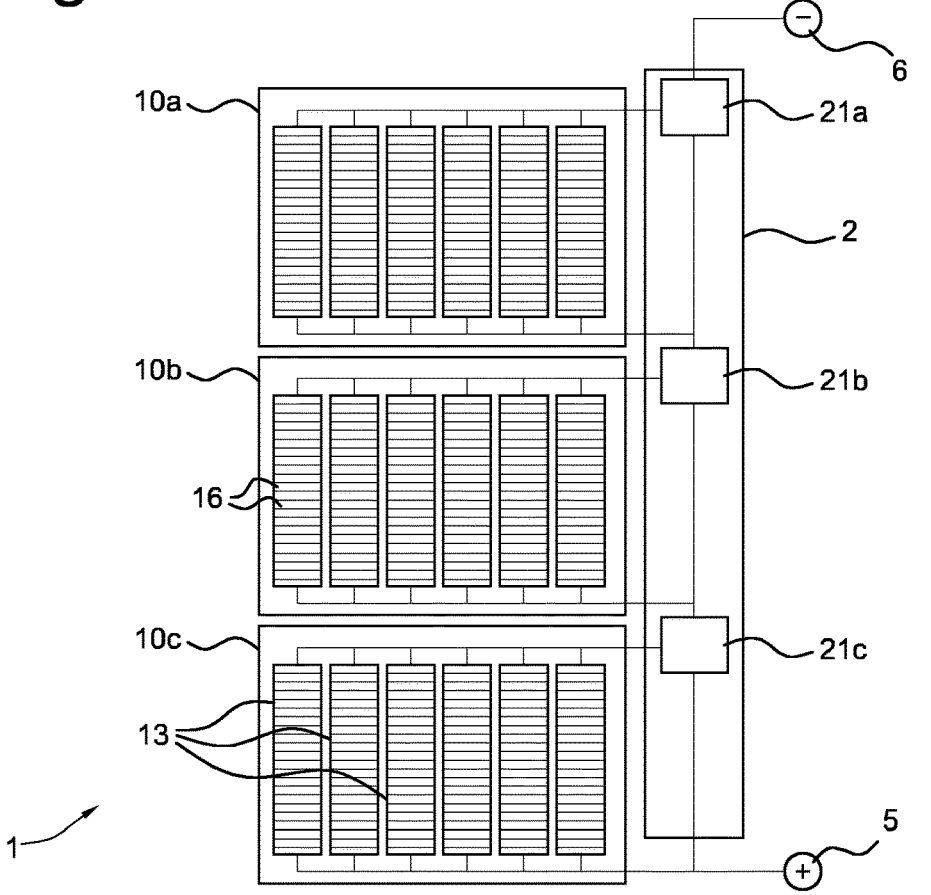
FIG. 5 shows a schematic view of a photovoltaic module, according to a 'Shingle' module embodiment of the present invention.

FIG. 5 shows a schematic view of a photovoltaic module, according to an even further exemplary embodiment of the present invention, wherein each of the x parallel-connected sub-strings 13 comprises y series-connected sub-cells 16, and wherein the y series-connected sub-cells 16 are arranged in a one-dimensional array. In other wording, a 'shingle' (solar cell) module is provided in the embodiment of FIG. 5, whereby the y series-connected sub-cells 16 are connected in a straight array.

As known to the person skilled in the art, the (sub-)cells in a shingle module are connected in series by connecting them at the edges, e.g. at the top of one (sub-)cell to the bottom of another (sub-)cell, such that the (sub-)cells overlap. Thus, since there is no gap between the (sub-)cells, shingle modules have a high efficiency output. In the context of this embodiment, the shade performance of the shingle module is also significantly improved by providing a power optimizer circuit 21a-c for each of the at least two sub-modules 10a-c.

In a specific embodiment of FIG. 5, each sub-cell 16 has a rectangular shape, wherein the rectangular shape originates from cutting the original square cell in smaller, individual strokes e.g. ¼-⅙ strokes. Similar to the split-cell module embodiment (in FIG. 4) described above, by having smaller sub-cells 16, the resistive losses are lower, leading to better efficiency.

As shown in the exemplary example in FIG. 5, each of the at least two sub-modules 10a-c may comprise 6 parallel-connected sub-strings 13, wherein each of the 4-6 parallel-connected sub-strings 13 may comprise 22 series-connected sub-cells 16, wherein the 22 series-connected sub-cells 16 originate from e.g. ⅙ strokes of an original square cell. Overall, a PV module 1 is provided in a shingle module form, whereby a large number of y series-connected sub-cells 16 provides good efficiency performance of the PV module 1, yet, of easy assembly.

It is re-iterated that the exemplary embodiment shown in FIG. 5 is a non-limiting example, whereby the rectangular shape of the y series-connected sub-cells 16 may originate from larger or smaller strokes, e.g. ⅕ or ⅐ strokes of an original square cell.

In yet another embodiment of the present invention, the y series-connected sub-cells 16 having a dimension of ¹⁄₁₆ of a singular PV wafer. For example, if the PV module 1 is built from 6.0×6.0-inch wafers (15.24×15.24 cm), then the y series-connected sub-cells 16 would have a dimension equal to 1.5×1.5-inch (3.81×3.81 cm). In this respect, even when compared to e.g. a standard 60 cell module with power optimizers, the present invention has a major advantage in that the x parallel-connected sub-strings 13 are a factor of 16 smaller than e.g. a sub-string with 20 standard cells, leading to increased shadow performance. The PV module 1, in any one of the embodiments described herein, may be connected in series with PV modules 1 using standard string inverters. This obviates the need for modules with embedded substring optimizers, providing a cost-effective technique to (series-) connect e.g. another group of PV modules 1 with good shadow performance.

Further, it has been mentioned that the PV module 1 can be assembled together with ease. To elaborate further on this point, during assembly of the PV module 1, it is possible to use a pick and place robot with a vision system to position and place the y series-connected sub-cells 16 onto the back conductive sheet. Further, when laminating the PV module 1, a standard process to ensure the stacking and fusing of the PV module components, the connections between y series-connected sub-cells 16 and back conductive sheet are easily established, assuming back-contact solar cells are used.

Moreover, the PV module 1, in any one of the embodiments described herein, is suitable for the 'Building Integrated PV' (BIPV) market. The PV module 1 may be manufactured with the required BIPV sizes, e.g. as an BIPV element of 0.9×1.2 m, and without the need to consider shadows by dormers, poles and orientation.

It is re-iterated that the present invention embodiments and examples described above are non-limiting. For example, the area occupied by the at least two sub-modules 10a-c, number of y series-connected cells 16 and number of x parallel-connected sub-strings 13 may all be varied.

The present invention has been described above with reference to a number of exemplary embodiments as shown in the drawings. Modifications and alternative implementations of some parts or elements are possible, and are included in the scope of protection as defined in the appended claims.

The invention claimed is:

1. A photovoltaic (PV) module comprising
   a positive terminal,
   a negative terminal,
   at least two sub-modules, wherein each of the at least two sub-modules comprises x parallel-connected sub-strings,
   wherein each of the x parallel-connected sub-strings comprises y series-connected sub-cells,
   wherein the y series-connected sub-cells are arranged in an array,
   the PV module further comprising a back conductive sheet comprising:
      a first connection path arranged for connecting the x parallel-connected sub-strings of each of the at least two sub-modules;
      a plurality of second connection paths arranged for connecting the y series-connected sub-cells of each x parallel-connected sub-string, wherein the plurality of second connection paths comprise insulated wiring islands provided in the back conductive sheet to form a local string wiring chain for series connecting the y series-connected sub-cells; and
      a primary sheet layer and a secondary sheet layer to provide the first connection path and the plurality of second connection paths, wherein the primary sheet layer provides the first connection path and the secondary sheet layer provides the plurality of second connection paths, such that the first connection path does not interfere with the plurality of second connection paths;
   wherein each of the at least two sub-modules is provided with a power optimizer circuit, and the output of the power optimizer circuits are connected in series between the positive terminal and the negative terminal.

2. The PV module according to claim 1, further comprising a junction box comprising connection circuitry providing the connection of the at least two sub-modules to the associated power optimizer circuit and to the positive and negative terminal.

3. The PV module according to claim 1, wherein the power optimizer circuit comprises an integrated circuit.

4. The PV module according to claim 3, wherein the integrated circuit is provided in a laminated layer of the PV module.

5. The PV module according to claim 1, wherein the power optimizer circuit comprises a buck converter with maximum power point tracking.

6. The PV module according to claim 1, wherein the first connection path is isolated from the plurality of second connection paths.

7. The PV module according to claim 1, wherein x is at least 2.

8. The PV module according to claim 1, wherein y is less than or equal to 20.

9. The PV module according to claim 1, wherein the x parallel-connected sub-strings are arranged in a rectangular array.

10. The PV module assembly according to claim 9, wherein the y series-connected sub-cells are arranged in a rectangular array and are interconnected in a meandering pattern.

11. The PV module according to claim 1, wherein the y series-connected sub-cells each comprise a string of split sub-cells.

12. The PV module according to claim 1, wherein the y series-connected sub cells are arranged in a one-dimensional array.

13. The PV module according to claim 12, wherein each sub-cell has a rectangular shape.

14. The PV module according to claim 1, wherein the sub-cells have a dimension of $\frac{1}{16}$ of a singular PV wafer.

* * * * *